(12) United States Patent
Lin

(10) Patent No.: US 10,714,164 B2
(45) Date of Patent: Jul. 14, 2020

(54) DYNAMIC RANDOM ACCESS MEMORY

(71) Applicant: Winbound Electronics Corp., Taichung (TW)

(72) Inventor: Che-Min Lin, Taichung (TW)

(73) Assignee: Windbond Electronics Corp., Taichung (TW)

( * ) Notice: Subject to any disclaimer, the term of this patent is extended or adjusted under 35 U.S.C. 154(b) by 0 days.

(21) Appl. No.: 16/161,084

(22) Filed: Oct. 16, 2018

(65) Prior Publication Data

US 2019/0198091 A1   Jun. 27, 2019

(30) Foreign Application Priority Data

Dec. 27, 2017  (CN) .......................... 2017 1 1443484

(51) Int. Cl.
  *G11C 11/406*   (2006.01)
  *G11C 11/4091*  (2006.01)
  *G11C 11/4097*  (2006.01)

(52) U.S. Cl.
  CPC .... *G11C 11/40615* (2013.01); *G11C 11/4091* (2013.01); *G11C 11/4097* (2013.01); *G11C 11/406* (2013.01); *G11C 11/40618* (2013.01)

(58) Field of Classification Search
  CPC .......... G11C 11/40615; G11C 11/4091; G11C 11/4097
  USPC ....................................................... 365/222
  See application file for complete search history.

(56) References Cited

U.S. PATENT DOCUMENTS

| | | | | |
|---|---|---|---|---|
| 6,061,278 A | * | 5/2000 | Kato ...................... | G11C 7/065 365/190 |
| 6,847,566 B1 | * | 1/2005 | Han ........................ | G11C 7/06 365/203 |
| 7,248,528 B2 | | 7/2007 | Riho et al. | |
| 7,286,377 B1 | * | 10/2007 | Pyeon ..................... | G11C 7/04 365/189.09 |
| 7,342,835 B2 | * | 3/2008 | Tu ......................... | G11C 7/1018 365/185.25 |
| 9,299,414 B1 | | 3/2016 | Lin | |
| 2003/0231521 A1 | * | 12/2003 | Ohsawa ................. | G11O 5/147 365/174 |
| 2006/0114735 A1 | * | 6/2006 | Takahashi ............. | G11C 11/406 365/222 |
| 2008/0037344 A1 | * | 2/2008 | Kobayashi .............. | G11C 7/12 365/203 |
| 2008/0056045 A1 | * | 3/2008 | Proell .................... | G11C 7/12 365/222 |
| 2008/0106964 A1 | | 5/2008 | Kajigaya | |
| 2008/0130358 A1 | * | 6/2008 | Fukuda .................. | G11C 7/065 365/174 |

(Continued)

*Primary Examiner* — Ly D Pham
(74) *Attorney, Agent, or Firm* — JCIPRNET

(57) ABSTRACT

A dynamic random access memory including a memory cell array and a memory controller is provided. The memory cell array includes a plurality of bit lines, a plurality of word lines, and a plurality of memory cells. The memory controller is coupled to the memory cells via the bit lines and the word lines. The memory controller is configured to perform a self-refresh operation on the memory cell array during a self-refresh period. Each of the bit lines includes a switch element. The memory controller controls a part of the switch elements to be conducted and a part of the switch elements not to be conducted during the self-refresh period.

6 Claims, 5 Drawing Sheets

(56) References Cited

U.S. PATENT DOCUMENTS

2009/0187689 A1* 7/2009 Roohparvar .......... G11C 11/406
                                                710/100
2011/0305098 A1* 12/2011 Choi .................... G11C 11/406
                                                365/203

* cited by examiner

DYNAMIC RANDOM ACCESS MEMORY

CROSS-REFERENCE TO RELATED APPLICATION

This application claims the priority benefit of China application serial no. 201711443484.7, filed on Dec. 27, 2017. The entirety of the above-mentioned patent application is hereby incorporated by reference herein and made a part of this specification.

BACKGROUND OF THE INVENTION

1. Field of the Invention

The invention relates to a memory device. More particularly, the invention relates to a dynamic random access memory (DRAM).

2. Description of Related Art

Generally speaking, the self-refresh operation is performed by the dynamic random access memory in the standby mode. If the self-refresh current is overly high, the dynamic random access memory may generate excessive power consumption in the standby mode.

The number of the word lines coupled to the bit lines may be decreased so as to reduce the equivalent capacitance of the bit lines in the existing technologies, such that, the problem of overly high self-refresh current may be solved. The equivalent capacitance of the bit lines is decreased by applying this method; nevertheless, the area of the memory chip is increased.

SUMMARY OF THE INVENTION

The invention provides a dynamic random access memory having a low self-refresh current during a self-refresh period.

A dynamic random access memory in an embodiment of the invention includes a memory cell array and a memory controller. The memory cell array includes a plurality of bit lines, a plurality of word lines, and a plurality of memory cells. The memory controller is coupled to the memory cells via the bit lines and the word lines. The memory controller is configured to perform a self-refresh operation on the memory cell array during a self-refresh period. Each of the bit lines includes a switch element. The memory controller controls a part of the switch elements to be conducted and a part of the switch elements not to be conducted during the self-refresh period.

In an embodiment of the invention, the switch elements include a plurality of first switch elements and a plurality of second switch elements. The bit lines including the first switch elements are coupled to a first sense amplifier circuit. The bit lines including the second switch elements are coupled to a second sense amplifier circuit. The memory controller controls a conduction state of the first switch elements by using a first control signal. The memory controller controls a conduction state of the second switch elements by using a second control signal.

In an embodiment of the invention, the self-refresh period includes a first period and a second period. The memory controller controls the first switch elements to be conducted and the second switch elements not to be conducted during the first period. The memory controller controls the first switch elements not to be conducted and the second switch elements to be conducted during the second period.

In an embodiment of the invention, each of the switch elements includes a first terminal, a second terminal, and a control terminal. Each of the bit lines includes a first node, a second node, a third node, and a fourth node. The first node of each of the bit lines is coupled to the corresponding memory cell. The second node of each of the bit lines is coupled to the first terminal of each of the switch elements. The third node of each of the bit lines is coupled to the second terminal of each of the switch elements. The fourth node of each of the bit lines is coupled to a corresponding sense amplifier circuit of each of the switch elements. The control terminal of each of the switch elements receives a control signal.

In an embodiment of the invention, a first number of the memory cells are coupled between the first node and the second node of each of the bit lines, and a second number of the memory cells are coupled between the third node and the fourth node of each of the bit lines. The first number and the second number are equal.

In an embodiment of the invention, a first number of the memory cells are coupled between the first node and the second node of each of the bit lines, and a second number of the memory cells are coupled between the third node and the fourth node of each of the bit lines. The first number and the second number are unequal.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
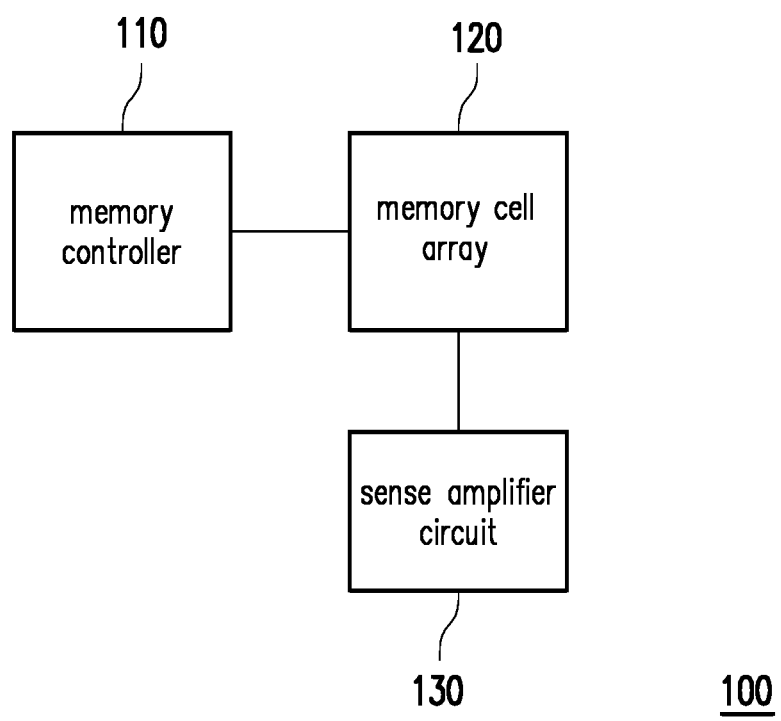
FIG. 1 is a schematic diagram illustrating a dynamic random access memory according to an embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

Embodiments are provided below to describe the invention in detail, though the invention is not limited to the provided embodiments, Suitable combinations among the embodiments are also allowed.

Figure 2:
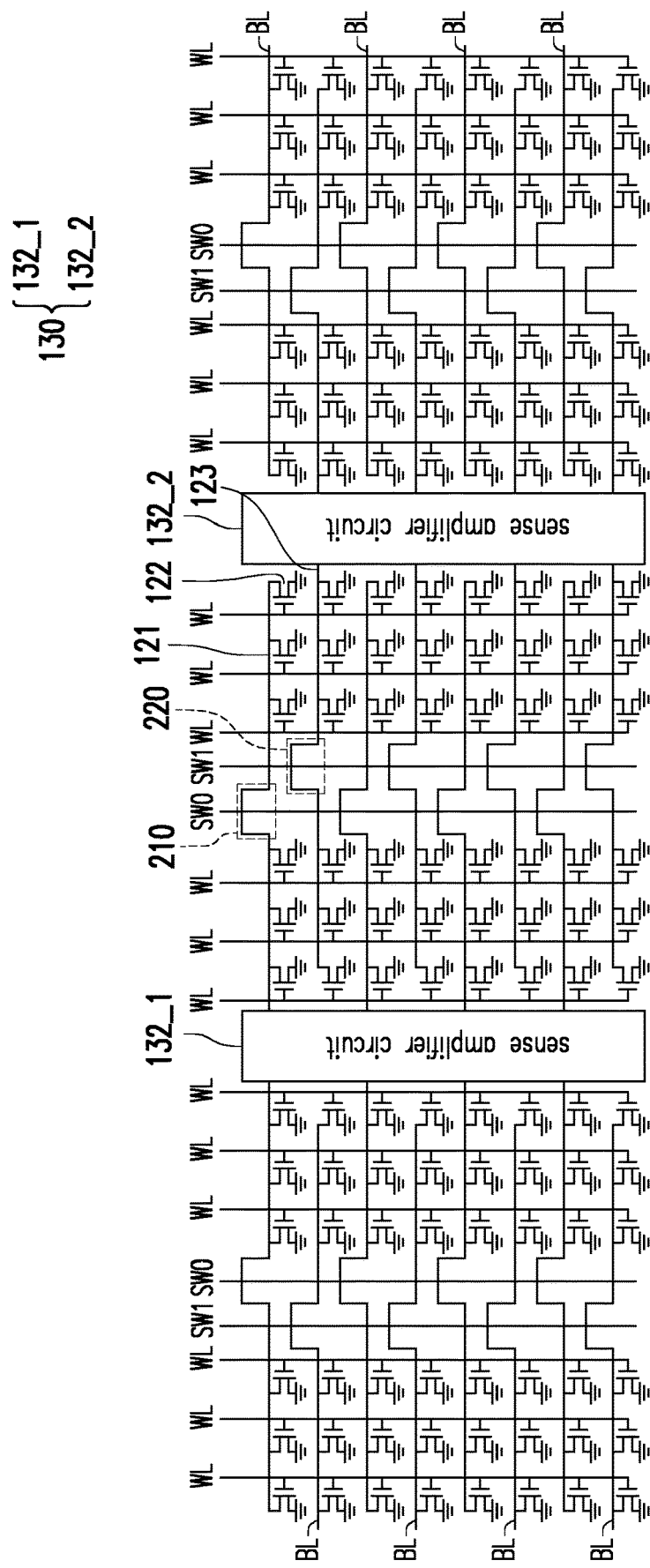
FIG. 2 is a schematic diagram illustrating a memory cell array and a sense amplifier circuit of FIG. 1.

FIG. 1 is a schematic diagram illustrating a dynamic random access memory according to an embodiment of the invention. FIG. 2 is a schematic diagram illustrating a memory cell array and a sense amplifier circuit of FIG. 1.

With reference to FIG. 1 and FIG. 2, a dynamic random access memory 100 of this embodiment includes a memory controller 110, a memory cell array 120, and a sense amplifier circuit 130. The memory cell array 120 includes a plurality of bit lines BL, a plurality of word lines WL, and a plurality of memory cells 122. The memory controller 110 is coupled to the memory cells 122 via the bit lines BL and the word lines WL. In this embodiment, the memory controller 110 is configured to perform a self-refresh operation on the memory cell array 120 during a self-refresh period, and people having ordinary skill in the art may acquire sufficient teachings, suggestions, and other details related to the method of the operation.

Each of the bit lines BL includes a switch element 210 or a switch element 220 in this embodiment. The memory controller 110 controls a part of the switch elements 210 or 220 to be conducted and a part of the switch elements 210 or 220 not to be conducted during the self-refresh period. To be specific, a bit line 121 is coupled to a first sense amplifier circuit 132_1 and includes the first switch element 210 in this embodiment. A control terminal of the first switch element 210 receives a first control signal SW0. A bit line 123 is coupled to a second sense amplifier circuit 132_2 and includes the second switch element 220. A control terminal of the second switch element 220 receives a second control signal SW1. In this embodiment, the memory controller 110 controls conduction states of the first switch elements 210 and the second switch elements 220 by using the first control signal SW0 and the second control signal SW1 respectively.

Figure 3:
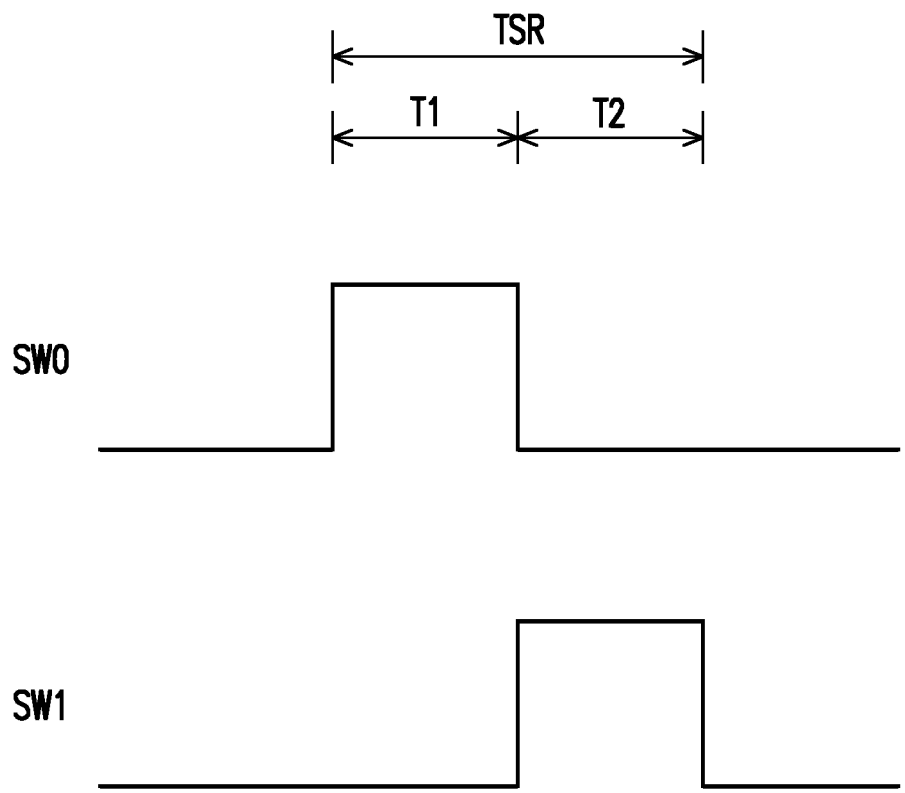
FIG. 3 is a schematic diagram illustrating a first control signal and a second control signal according to an embodiment of the invention.

FIG. 3 is a schematic diagram illustrating a first control signal and a second control signal according to an embodiment of the invention. With reference to FIG. 1 to FIG. 3, the memory controller 110 of this embodiment performs the self-refresh operation on the memory cell array 120 during a self-refresh period TSR. In this embodiment, the self-refresh period TSR includes a first period T1 and a second period T2. During the first period T1, the first control signal SW0 is at a high level, and the second control signal SW1 is at a low level. The memory controller 110 controls the first switch elements 210 to be conducted by using the first control signal SW0 and controls the second switch elements 220 not to be conducted by using the second control signal SW1. As such, an equivalent capacitance of the bit line 123 may be decreased during the first period T1. During the second period T2, the first control signal SW0 is at the low level, and the second control signal SW1 is at the high level. The memory controller 110 controls the first switch elements 210 not to be conducted by using the first control signal SW0 and controls the second switch elements 220 to be conducted by using the second control signal SW1. As such, an equivalent capacitance of the bit line 121 may be decreased during the second period T2.

Although only the bit lines 121 and 123 and the switch elements 210 and 220 are illustrated as an example in this embodiment, the operation method of the rest of the bit lines BL and the switch elements may be deduced by analogy. Therefore, during the self-refresh period TSR, an overall equivalent capacitance of the bit lines BL may be decreased in this embodiment, and a self-refresh current is thereby reduced.

Figure 4A:
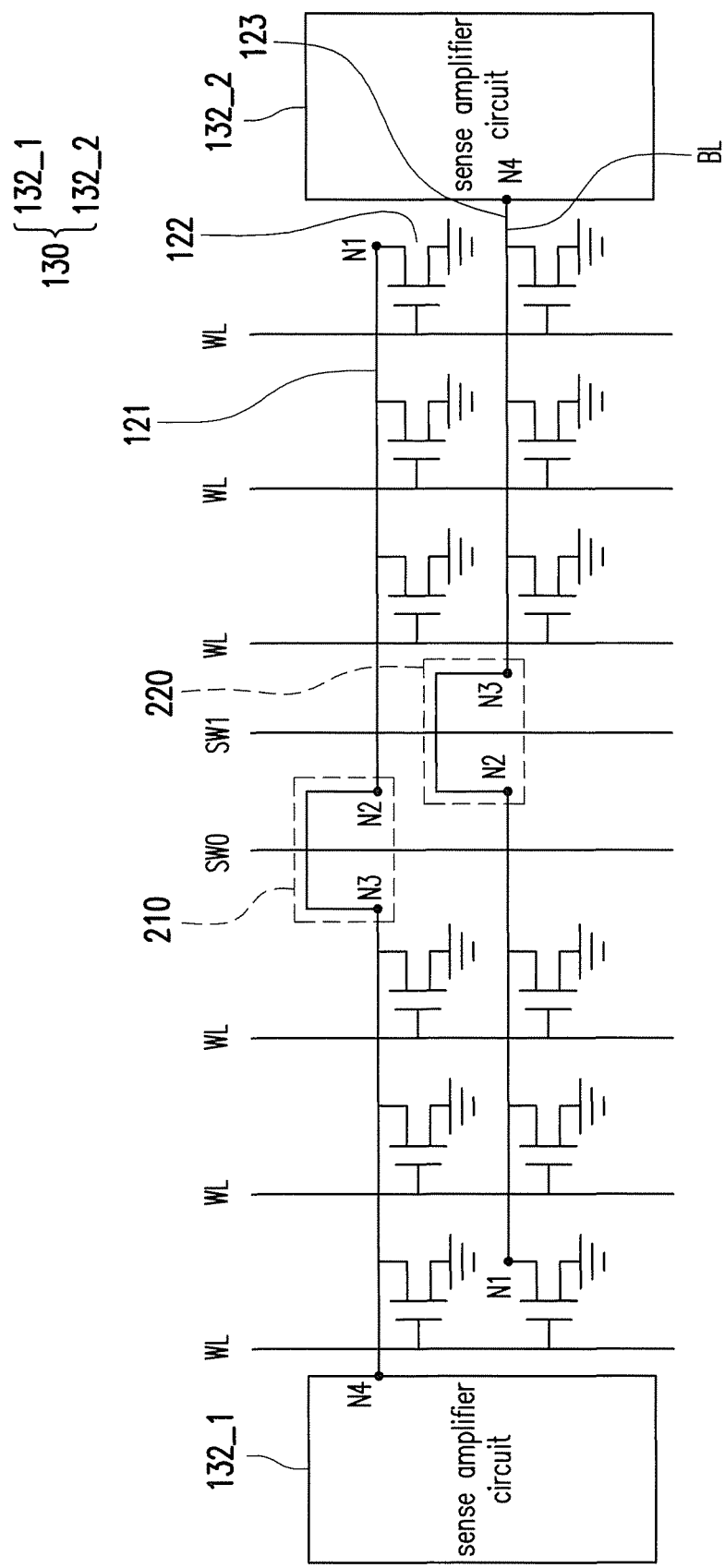
FIGS. 4A-4B are schematic diagrams illustrating a portion of the memory cell array and a portion of the sense amplifier circuit of FIG. 2.
Figure 4B:
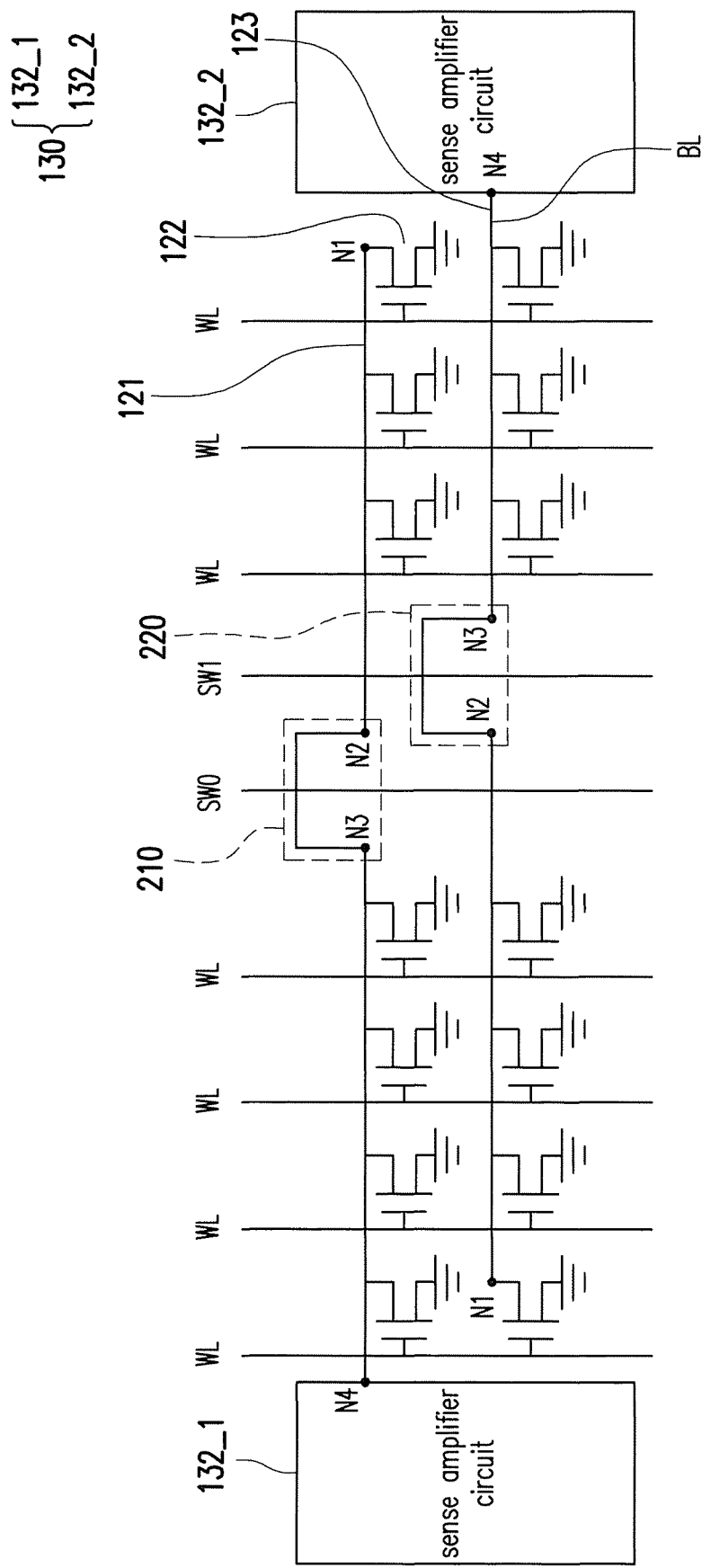

FIGS. 4A-4B are schematic diagrams illustrating a portion of the memory cell array and a portion of the sense amplifier circuit of FIG. 2. In this embodiment, a number of the memory cells coupled between a first node N1 and a second node N2 of the bit line 121 is, for example, N (including the memory cell coupled to the first node N1), and a number of the memory cells coupled between a third node N3 and a fourth node N4 of the bit line 121 is, for example M, wherein M and N are positive integers. The first number N and the second number M are equal in this embodiment, as shown in FIG. 4A. The first number N and the second number M may be unequal in an embodiment, as shown in FIG. 4B. A number of the memory cells coupled to the bit line 123 may also be deduced by analogy.

In this embodiment, the switch elements may be divided into two groups. That is, the switch element (the first switch element 210) controlled by the first signal SW0 may be classified as a first group, and the switch element (the second switch element 220) controlled by the second control signal SW1 may be classified as a second group. As such, the bit lines BL may be divided into two groups as well, that is, the bit lines BL including the first switch element 210 and the bit lines BL including the second switch element 220. But the invention is not limited thereto. In an embodiment, the switch elements may be divided into three or more groups when being controlled by three or more control signals. Therefore, during the self-refresh period TSR, overall reduction of equivalent capacitance of the bit lines BL may be adjusted according to design requirement.

In view of the foregoing, in the embodiments of the invention, each of the bit lines includes the switch element. During the self-refresh period, a part of the switch elements are conducted, and a part of the switch elements are not conducted. Therefore, the overall equivalent capacitance of the bit lines may be reduced during the self-refresh period, and the self-refresh current may thereby be decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic random access memory, comprising:
a memory cell array, comprising a plurality of bit lines, a plurality of word lines, and a plurality of memory cells; and
a memory controller, coupled to the memory cells via the bit lines and the word lines and configured to perform a self-refresh operation on the memory cell array during a self-refresh period,
wherein each of the bit lines comprises a switch element disposed between the plurality of word lines, and the memory controller controls a part of the switch elements to be conducted and a part of the switch elements not to be conducted during the self-refresh period,
wherein the switch elements comprises a plurality of first switch elements and a plurality of second switch elements, the bit lines comprising the first switch elements are coupled to a first sense amplifier circuit without being coupled to a second sense amplifier, and the bit lines comprising the second switch elements are coupled to the second sense amplifier circuit without being coupled to the first sense amplifier.

2. The dynamic random access memory as claimed in claim 1, wherein the memory controller controls a conduction state of the first switch elements by using a first control signal, and the memory controller controls a conduction state of the second switch elements by using a second control signal.

3. The dynamic random access memory as claimed in claim 2, wherein the self-refresh period comprises a first period and a second period, the memory controller controls the first switch elements to be conducted and the second switch elements not to be conducted during the first period, and the memory controller controls the first switch elements not to be conducted and the second switch elements to be conducted during the second period.

4. The dynamic random access memory as claimed in claim 1, wherein each of the switch elements comprises a first terminal, a second terminal, and a control terminal, each of the bit lines comprises a first node, a second node, a third node, and a fourth node, the first node of each of the bit lines is coupled to the corresponding memory cell, the second node of each of the bit lines is coupled to the first terminal of each of the switch elements, the third node of each of the bit lines is coupled to the second terminal of each of the switch elements, the fourth node of each of the bit lines is coupled to a corresponding sense amplifier circuit, and the control terminal of each of the switch elements receives a control signal.

5. The dynamic random access memory as claimed in claim 4, wherein a first number of the memory cells are coupled between the first node and the second node of each of the bit lines, a second number of the memory cells are coupled between the third node and the fourth node of each of the bit lines, and the first number and the second number are equal.

6. The dynamic random access memory as claimed in claim 4, wherein a first number of the memory cells are coupled between the first node and the second node of each of the bit lines, a second number of the memory cells are coupled between the third node and the fourth node of each of the bit lines, and the first number and the second number are unequal.

* * * * *

UNITED STATES PATENT AND TRADEMARK OFFICE
CERTIFICATE OF CORRECTION

PATENT NO. : 10,714,164 B2  
APPLICATION NO. : 16/161084  
DATED : July 14, 2020  
INVENTOR(S) : Che-Min Lin Page 1 of 1

It is certified that error appears in the above-identified patent and that said Letters Patent is hereby corrected as shown below:

On the Title Page

Item (71) Applicant should read:  
Winbond Electronics Corp., Taichung City (TW)

Item (72) Inventor should read:  
Che-Min Lin, Taichung City (TW)

Item (73) Assignee should read:  
Winbond Electronics Corp., Taichung City (TW)

Signed and Sealed this  
Twenty-second Day of September, 2020

Andrei Iancu  
*Director of the United States Patent and Trademark Office*